US009110138B2

United States Patent
Guo et al.

(10) Patent No.: US 9,110,138 B2
(45) Date of Patent: Aug. 18, 2015

(54) FAULT DICTIONARY BASED SCAN CHAIN FAILURE DIAGNOSIS

(71) Applicant: Mentor Graphics Corporation, Wilsonville, OR (US)

(72) Inventors: Ruifeng Guo, Portland, OR (US); Yu Huang, Sudbury, MA (US); Wu-Tung Cheng, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/139,480

(22) Filed: Dec. 23, 2013

(65) Prior Publication Data

US 2014/0115413 A1   Apr. 24, 2014

Related U.S. Application Data

(62) Division of application No. 11/818,440, filed on Jun. 13, 2007, now Pat. No. 8,615,695.

(60) Provisional application No. 60/921,993, filed on Apr. 4, 2007.

(51) Int. Cl.
*G01R 31/28* (2006.01)
*G01R 31/3177* (2006.01)
*G01R 31/3185* (2006.01)

(52) U.S. Cl.
CPC .... *G01R 31/3177* (2013.01); *G01R 31/318525* (2013.01); *G01R 31/318541* (2013.01)

(58) Field of Classification Search
None
See application file for complete search history.

(56) References Cited

U.S. PATENT DOCUMENTS

| | | | |
|---|---|---|---|
| 4,228,537 A | 10/1980 | Henckels et al. | |
| 5,570,376 A | 10/1996 | Kunda et al. | |
| 5,640,403 A | 6/1997 | Ishiyama et al. | |
| 5,663,967 A | 9/1997 | Lindberg et al. | |
| 5,799,022 A | 8/1998 | Williams | |
| 6,708,306 B2 | 3/2004 | Bartenstein et al. | |
| 6,874,109 B1 | 3/2005 | Rajski et al. | |
| 7,302,624 B2 * | 11/2007 | Rajski et al. | 714/732 |
| 7,437,640 B2 | 10/2008 | Rajski et al. | |
| 7,729,884 B2 | 6/2010 | Huang et al. | |
| 8,280,688 B2 | 10/2012 | Huang et al. | |
| 2004/0205436 A1 | 10/2004 | Kundu et al. | |
| 2006/0041812 A1 * | 2/2006 | Rajski et al. | 714/742 |
| 2006/0041813 A1 * | 2/2006 | Rajski et al. | 714/742 |
| 2006/0066338 A1 | 3/2006 | Rajski et al. | |
| 2006/0069972 A1 | 3/2006 | Guettaf | |

(Continued)

FOREIGN PATENT DOCUMENTS

WO   WO 2007/109322   9/2007

OTHER PUBLICATIONS

Abramovici et al., Digital Systems Testing and Testable Design, *IEEE Press*, pp. 226-227, 234-240 (1995).

(Continued)

*Primary Examiner* — Daniel McMahon
(74) *Attorney, Agent, or Firm* — Klarquist Sparkman, LLP

(57) ABSTRACT

A dictionary-based scan chain fault detector includes a dictionary with fault signatures computed for scan cells in the scan chain. Entries in the fault dictionary are compared with failures in the failure log to identify a faulty scan cell. In one embodiment a single fault in a scan chain is identified. In another embodiment, a last fault and a first fault in a scan chain are identified.

18 Claims, 9 Drawing Sheets

(56) References Cited

U.S. PATENT DOCUMENTS

| | | |
|---|---|---|
| 2006/0111873 A1 | 5/2006 | Huang et al. |
| 2007/0038911 A1 | 2/2007 | Koenemann et al. |
| 2007/0226570 A1 | 9/2007 | Zou et al. |
| 2009/0177936 A1 | 7/2009 | Koenemann et al. |

OTHER PUBLICATIONS

Abramovici et al., "Fault Diagnosis Based on Effect-Cause Analysis: An Introduction," *Proc. DAC*, pp. 69-76 (1980).

Amyeen et al., "Improving Precision Using Mixed-Level Fault Diagnosis," *International Test Conference*, 10 pp. (Oct. 2006).

Appello et al., "Yield Analysis of Logic Circuits," *Proc. of VTS*, pp. 103-108 (2004).

Bartenstein et al., "Diagnosing Combinational Logic Designs Using the Single Location At-a-Time (SLAT) Paradigm," *International Test Conference*, pp. 287-296 (2001).

Bartenstein et al., "Integrating Logical and Physical Analysis Capabilities for Diagnostics," *Proc. of ISTFA*, pp. 521-526 (2004).

Bernardi et al., "A Pattern Ordering Algorithm for Reducing the Size of Fault Dictionaries," *Proceedings of the 24th IEEE VLSI Test Symposium (VTS 2006)*, pp. 386-391 (Apr. 30, 2006).

Bodoh et al., "Diagnostic Fault Simulation for the Failure Analyst," *Proc. of ISTFA*, pp. 181-190 (2004).

Boppana et al., "Full Fault Dictionary Storage Based on Labeled Tree Encoding," *Proc. VTS / 14th VLSI Test Symposium*, pp. 174-179 (1996).

Cheng et al., "Compactor Independent Direct Diagnosis," *Proc. ATS*, pp. 204-209 (2004).

Chess et al., "Creating Small Fault Dictionaries," *IEEE Trans. Computer-Aided Design of Integrated Circuits and Systems*, vol. 18, No. 3, pp. 346-356 (Mar. 1999).

Crouch, "Debugging and Diagnosing Scan Chains," *EDFAS*, vol. 7, pp. 16-24 (Feb. 2005).

De et al., "Failure Analysis for Full-Scan Circuits," *Proceedings of ITC 1995*, pp. 636-645 (1995).

Edirisooriya et al., "Scan Chain Fault Diagnosis with Fault Dictionaries," *IEEE International Symposium on Circuits and Systems (ISCAS 1995)*, pp. 1912-1915 (Apr. 30, 1995).

Erb et al., "Yield Enhancement Through Fast Statistical Scan Test Analysis for Digital Logic," *Proc. of Adv. Semi. Manuf. Conf. and Workshop*, pp. 250-255 (Apr. 11-12, 2005).

Guo et al., "Fault Dictionary Based Scan Chain Failure Diagnosis," *Proceedings of the 16th Asian Test Symposium*, pp. 45-52 (Oct. 2007).

Guo et al., "A Technique for Fault Diagnosis of Defects in Scan Chains," *Proceedings of ITC*, pp. 268-277 (Oct. 2001).

Hirase et al., "Scan Chain Diagnosis using IDDQ Current Measurement," *Proceedings of the Asian Test Symposium*, pp. 153-157 (1999).

Hora et al., "An Effective Diagnosis Method to Support Yield Improvement," *International Test Conference*, pp. 260-269 (2002).

Huang et al., "Compressed Pattern Diagnosis for Scan Chain Failures," *Proceedings of the 2005 IEEE International Test Conference*, 10 pp. (Nov. 8, 2005).

Huang et al., "Statistical Diagnosis for Intermittent Scan Chain Hold-Time Fault," *Proceedings of ITC*, pp. 319-328 (2003).

Kao et al., "Jump Simulation: A Technique for Fast and Precise Scan Chain Fault Diagnosis," *Proceedings of ITC*, pp. 1-9 (Oct. 2006).

Keim et al., "A Rapid Yield Learning Flow Based on Production Integrated Layout-Aware Diagnosis," *International Test Conference*, 10 pp. (Oct. 2006).

Kruseman et al., "Systematic Defects in Deep Sub-Micron Technologies," *International Test Conference*, pp. 290-299 (2004).

Kundu, "Diagnosing Scan Chain Faults," *IEEE Transactions on VLSI Systems*, vol. 2, No. 4, pp. 512-516 (Dec. 1994).

Lavo et al., "Making Cause-Effect Cost Effective: Low-Resolution Fault Dictionaries," *International Test Conference*, pp. 278-286 (2001).

Lavo et al., "Multiplets, Models, and the Search for Meaning: Improving Per-Test Fault Diagnosis," *International Test Conference*, pp. 250-259 (2002).

Leininger et al., "Compression Mode Diagnosis Enables High Volume Monitoring Diagnosis Flow," of *International Test Conference*, 10 pp. (Nov. 8-10, 2005).

Li, "Diagnosis of Single Stuck-at Faults and Multiple Timing Faults in Scan Chains," *IEEE Transactions on VLSI Systems*, vol. 13, pp. 708-718 (Jun. 2005).

Li, "Diagnosis of Multiple Hold-Time and Setup-Time Faults in Scan Chains," *IEEE Transactions Computer*, vol. 54, pp. 1467-1472 (Nov. 2005).

Lin et al., "Test Generation for Designs With Multiple Clocks," *IEEE Design Automation Conference*, pp. 662-667 (2003).

Mrugalski et al., "Fault Diagnosis in Designs With Convolutional Compactor," *International Test Conference*, pp. 498-507 (2004).

Narayanan et al., "An Efficient Scheme to Diagnose Scan Chains," *Proc. of the ITC*, pp. 704-713 (1997).

Pomeranz et al., "On Dictionary-Based Fault Location in Digital Logic Circuits," *IEEE TCAD*, pp. 48-59 (Jan. 1997).

Pomeranz et al., "On the Generation of Small Dictionaries for Fault Location", *Proc. International Conference on Computer-Aided Design*, pp. 272-279 (1992).

Rajski et al., "Embedded Deterministic Test," *IEEE TCAD*, vol. 23, No. 5, pp. 776-792 (May 2004).

Rajski et al., "Embedded Deterministic Test for Low Cost Manufacturing Test," *Proc. of the 2002 IEEE International Test Conference*, pp. 301-310 (2002).

Ryan et al., "Two-Stage Fault Locations," *International Test Conference*, pp. 963-968 (1991).

Schafer et al., "Partner SRLs for Improved Shift Register Diagnostics," *Proc. of VSLI Test Symposium*, pp. 198-201 (1992).

Schuermyer et al., "Identification of Systematic Yield Limiters in Complex ASICS Through Volume Structural Test Fail Data Visualization and Analysis," *International Test Conference*, 9 pp. (Nov. 8-10, 2005).

Seshadri et al., "Dominance Based Analysis for Large Volume Production Fail Diagnosis," *Proc. of VTS*, pp. 392-399 (Apr. 30-May 4, 2006).

Song et al., "Diagnostic Techniques for the IBM S/390 600MHz G5 Microprocessor," *Proceedings of ITC*, pp. 1073-1082 (1999).

Stanley, "High Accuracy Flush-and-Scan Software Diagnostic," *IEEE Design and Test of Computers*, pp. 56-62 (2000).

Stanojevic et al., "Enabling Yield Analysis with X-Compact," *International Test Conference*, pp. 1085-1092 (Nov. 8-10, 2005).

Tang et al., "Analyzing Volume Diagnosis Results With Statistical Learning for Yield Improvement," *Proc. of ETS*, pp. 145-150 (May 20-24, 2007).

Tang et al., "Improving Diagnosis Performance with Minimal Memory Overhead," *16th Asia Test Symposium*, pp. 281-287 (Oct. 8-11, 2007).

Venkataraman et al., "Poirot: Applications of a Logic Fault Diagnosis Tool," *IEEE Design & Test of Computers*, pp. 19-30 (Jan.-Feb. 2001).

Waicukauski et al., "Failure Diagnosis of Structured VLSI," *IEEE Design and Test of Computers*, vol. 6, No. 4, pp. 49-60 (1989).

Wang et al., "An Efficient and Effective Methodology on the Multiple Fault Diagnosis," *International Test Conference*, pp. 329-338 (2003).

Wang et al., "Analysis and Methodology for Multiple-Fault Diagnosis," *IEEE Trans. on Computer-Aided Design of Integrated Circuits and Systems*, vol. 25, No. 3, pp. 558-575 (Mar. 2006).

Wu, "Diagnosis of Scan Chain Failures," 6 pp. (also published as Wu, "Diagnosis of Scan Chain Failures," *Proc. of the 13th Int'l Symp. on Defect and Fault-Tolerance in VLSI Systems*, pp. 217-222 (1998)).

Yang et al., "Quick Scan Chain Diagnosis Using Signal Profiling," *Proc. of ICCD*, 4 pp. (Oct. 2005).

Zou et al., "Bridge Defect Diagnosis With Physical Information," *Proc. of ATS*, pp. 248-253, Dec. 18-21 (2005).

Zou et al., "On Methods to Improve Location Based Logic Diagnosis," *VLSI Design*, pp. 181-187 (Jan. 3-7, 2006).

Zou et al. "Speeding up Effect-Cause Defect Diagnosis using a Small Dictionary," *Proc. of VTS*, pp. 225-230 (May 6-10, 2007).

\* cited by examiner

Chain_0 Dictionary

| Cell_N | ... | Cell_2 | Cell_1 | Cell_0 |
|---|---|---|---|---|
| | | c | c | a |
| | | d | d | b |
| | | | f | c |
| | | | | d |
| | | | | e |
| | | | | g |

150

Failure Log a
b
c
d
e
f
g

160

Relative Signatures $rel\_Cell\_0 = Cell\_0 \ XOR \ Cell\_0$ $= [null]$ $rel\_Cell\_1 = Cell\_1 \ XOR \ rel\_Cell\_0$ $= [ \ c \ d \ f \ ]$ $rel\_Cell\_2 = Cell\_2 \ XOR \ rel\_Cell\_1$ $= [ \ f \ ]$

Relative Tester Failures $= Failure \ Log = XOR \ Cell\_0$ $= [ \ f \ ]$

*FIG. 6*

FAULT DICTIONARY BASED SCAN CHAIN FAILURE DIAGNOSIS

CROSS REFERENCE TO RELATED APPLICATION

This application is a divisional of U.S. patent Ser. No. 11/818,440, filed Jun. 13, 2007 (now U.S. Pat. No. 8,615,695) which claims the benefit of U.S. Provisional Application 60/921,993 filed Apr. 4, 2007, all of which are herein incorporated by reference.

FIELD

The present application relates generally to testing integrated circuits and in particular to testing scan chains in integrated circuits.

BACKGROUND

Most integrated circuits include various combinations of memory, combinational logic and sequential logic. As part of the process of making integrated circuits, these various components are tested to ensure that the circuits are operating as intended before the chips are cut from a wafer and packaged for use. As will be understood by those skilled in the art, one way to test the combinational logic is to configure the sequential logic such that the individual sequential logic elements (e.g., flip-flops, latches, and other such memory elements) can be serially coupled to one another to form a number of scan chains that provide inputs to the combinational logic. During testing, a circuit tester loads sequences of logic values (sometimes referred to as "test patterns") into the scan chains and records the behavior of the combinational logic circuits in response to the sequences. Any discrepancies between what was expected from the integrated circuit after being tested with a particular test pattern and what was actually observed are stored in a failure log. From the failure log, test engineers attempt to diagnose the location and type of defect causing the faulty behavior so that adjustments can be made to the manufacturing process or circuit design.

Because scan chains are used to detect defects in the combinational logic, it is desirable to confirm during testing that the scan chains themselves are operating correctly. If there is an error in the scan chain, it is desirably detected and corrected in the manufacturing process. Embodiments of the disclosed technology are directed to reducing the time is takes to correctly identify faults in one or more scan chains in an integrated circuit.

SUMMARY

Among the various exemplary techniques described herein is a technique for detecting errors in a scan chain using a fault dictionary. In certain embodiments, a dictionary-based fault detection system compares fault signatures stored for a scan cell of a scan chain with failures stored in a failure log. In one embodiment, a fault signature specifying the failures associated with a scan cell having a predefined fault is stored differentially in the fault dictionary. A complete fault signature can be re-created for each scan cell and compared to the failures in the failure log. In some embodiments, the differential fault signature is used to detect scan cell errors.

In one embodiment, a last fault of a scan chain is detected. In another embodiment, a last fault and a first fault in a scan chain are detected.

Any of the disclosed methods can be implemented as computer-readable media comprising computer-executable instructions for causing a computer to perform the methods. Any of the disclosed methods implemented in a computer environment can also be performed by a single computer or via a network. Further, computer-readable media storing identities of faulty scan (or any other final or intermediate results) produced by any of the disclosed methods are also disclosed.

BRIEF DESCRIPTION OF THE DRAWINGS

The foregoing and other objects, features, and advantages of the disclosed technology will become more apparent from the following detailed description, which proceeds with reference to the accompanying figures wherein:

FIG. 6 illustrates how a fault dictionary is used to identify a defective scan cell in a scan chain according to one disclosed embodiment;

DETAILED DESCRIPTION

Figure 1:
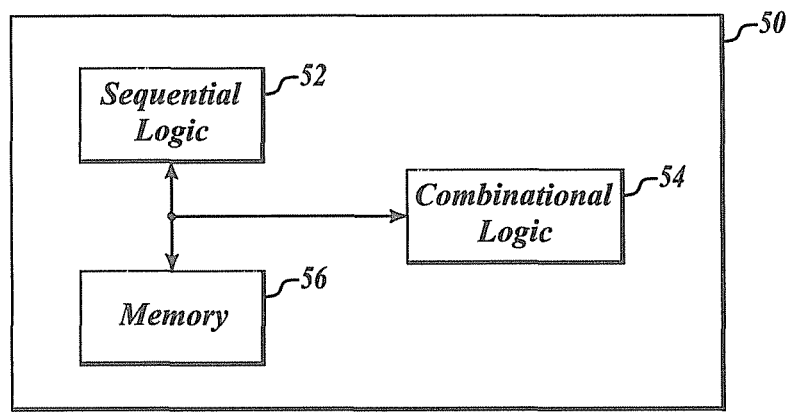
FIG. 1 illustrates a simplified integrated circuit.

Disclosed in further detail below are representative embodiments of methods, apparatus, and systems having particular applicability to testing, diagnosing, and improving the yield and quality of integrated circuits that should not be construed as limiting in any way. Instead, the present disclosure is directed toward all novel and non-obvious features and aspects of the various disclosed methods, apparatus, and systems, and their equivalents, alone and in various combinations and sub-combinations with one another. The disclosed technology is not limited to any specific aspect or feature, or combination thereof, nor do the disclosed methods, apparatus, and systems require that any one or more specific advantages be present or problems be solved.

Moreover, any of the methods, apparatus, and systems described herein can be used in conjunction with the manufacture and testing of a wide variety of integrated circuits (e.g., application-specific integrated circuits (ASICs), programmable logic devices (PLDs) such as a field-programmable gate arrays (FPGAs), or systems-on-a-chip (SoCs)), which utilize a wide variety of components (e.g., digital, analog, or mixed-signal components).

Although the operations of some of the disclosed methods are described in a particular, sequential order for convenient presentation, it should be understood that this manner of description encompasses rearrangement, unless a particular ordering is required by specific language set forth below. For example, operations described sequentially can be rearranged or performed concurrently. Moreover, for the sake of simplicity, the figures herein may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of environments. For example, any of the disclosed techniques can be implemented in whole or in part as software comprising computer-executable instructions stored on one or more computer-readable media (e.g., computer-readable media, such as one or more CDs, volatile memory components (such as DRAM or SRAM), or nonvolatile memory components (such as hard drives)). Such software can comprise, for example, electronic design automation (EDA) software tools (e.g., a failure diagnosis tool). The particular software tools described should not be construed as limiting in any way, however, as the principles disclosed herein are generally applicable to other software tools. Circuits that have defects that are detected using the disclosed techniques can in some circumstances be repaired and are considered to be within the scope of this disclosure.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. Any of the disclosed methods can alternatively be implemented (partially or completely) in hardware (e.g., an ASIC, PLD, or SoC).

Further, data produced from any of the disclosed methods or intermediate results from such methods can be created, updated, and/or stored on one or more computer-readable media (e.g., computer-readable media, such as one or more CDs, volatile memory components (such as DRAM or SRAM), or nonvolatile memory components (such as hard drives)) using a variety of different data structures or formats. For example, fault dictionaries generated according to embodiments of the disclosed technology can be stored on one or more computer-readable media. Such data can be created or updated at a local computer or over a network (e.g., by a server computer).

Moreover, any of the disclosed methods can be used in a computer simulation, ATPG, or other EDA environment, wherein test patterns (including compressed test patterns) and test responses are determined by or otherwise analyzed using representations of circuits and/or scan chains, which are stored on one or more computer-readable media. For presentation purposes, however, the present disclosure sometimes refers to a circuit or its circuit components by their physical counterpart (for example, scan cells, scan chains, logic gates, and other such terms). It should be understood, however, that any reference in the disclosure or the claims to a physical component includes representations of such circuit components as are used in simulation, ATPG, or other such EDA environments.

FIG. 1 illustrates a typical integrated circuit (IC) chip 50 that includes sequential logic 52, combinational logic 54 and embedded memory 56. As part of the manufacturing process, each circuit within the IC is tested before the chip is cut from a wafer and packaged for use. If defects are detected that indicate one or more circuits are not operating as desired, engineers analyze the defects to determine where the error is occurring and try to correct it.

Briefly stated, to determine if the combinational logic (e.g., the AND, OR, NAND, NOR, XOR or other logic gates) in the circuit is working properly, predetermined patterns of logic signals (e.g., scan test patterns) are loaded into the sequential logic circuits that feed the inputs of the combinational logic 54. The outputs of the combinational logic are collected and compared with expected outputs. Based on the results obtained, it is possible to identify likely places in the IC 50 where a defect has occurred.

To apply the predetermined patterns of logic signals to the inputs of the combinational logic circuits, the sequential logic 52 includes additional circuitry that allows the sequential logic to operate as scan chains. A scan chain includes a number of scan cells (formed from the sequential elements) that together operate as a shift register. The output of one scan cell is fed into the input of another scan cell and so on to allow a test pattern of logical 1's and 0's to be loaded into the scan chain. During normal operational use of the IC, the additional circuitry is disabled such that the scan cells function as the normal sequential logic intended in the design. The scan cells are generally comprised of flip flops, latches, or other circuit elements capable of capturing and storing a logic value for one or more clock cycles.

Figure 2:
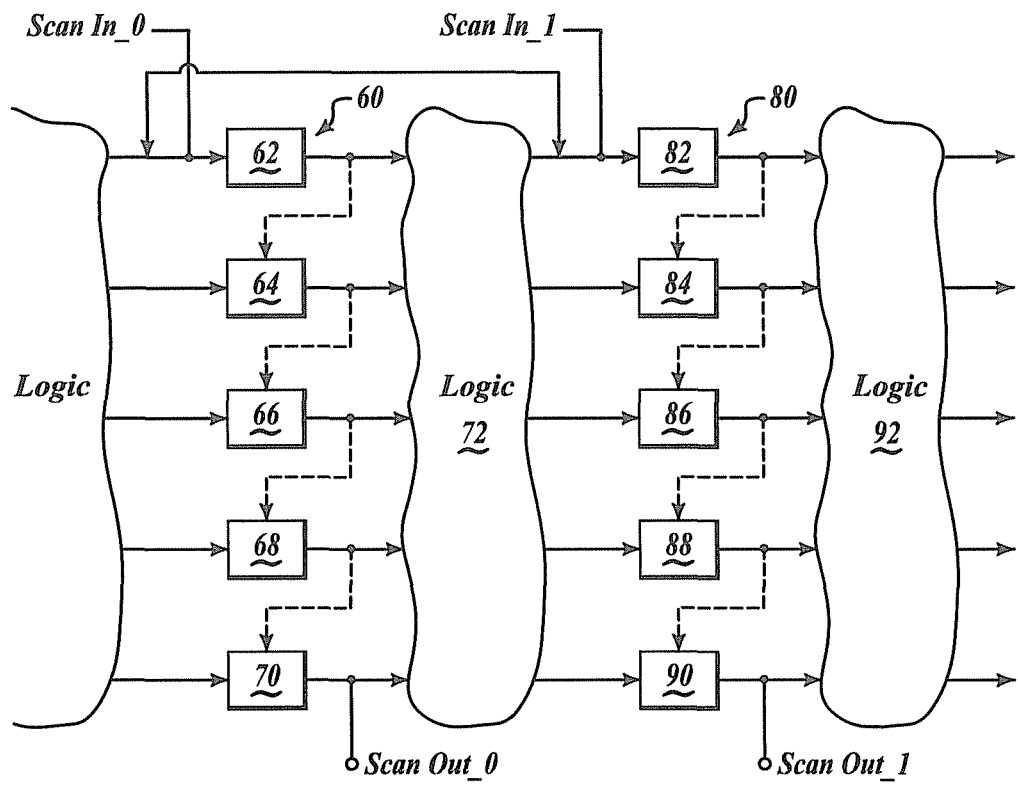
FIG. 2 illustrates a pair of scan chains that provide inputs to, and receive the outputs of, combinational logic circuits.

FIG. 2 illustrates a pair of scan chains 60 and 80 that feed inputs to and receive outputs from combinational logic 72 and 92. Scan chain 60 includes scan cells 62-70 and scan chain 80 includes scan cells 82-90. During use, a predetermined scan test pattern is loaded into an input, such as Scan_In_0, by clocking the individual scan cells in the chain until each scan cell has the correct input logic value. The scan cells in the scan chain are then operated in their normal operational mode and clocked to capture the output signals from the combinational logic circuits. The scan chains are then again operated in the scan mode and the values captured by each scan cell in a scan chain are clocked out serially and compared with an expected output. By comparing the logic values captured by each of the scan cells from a known pattern of inputs that are loaded into the sequential logic circuits, it can be determined if the combinational logic elements are working correctly.

Figure 3:
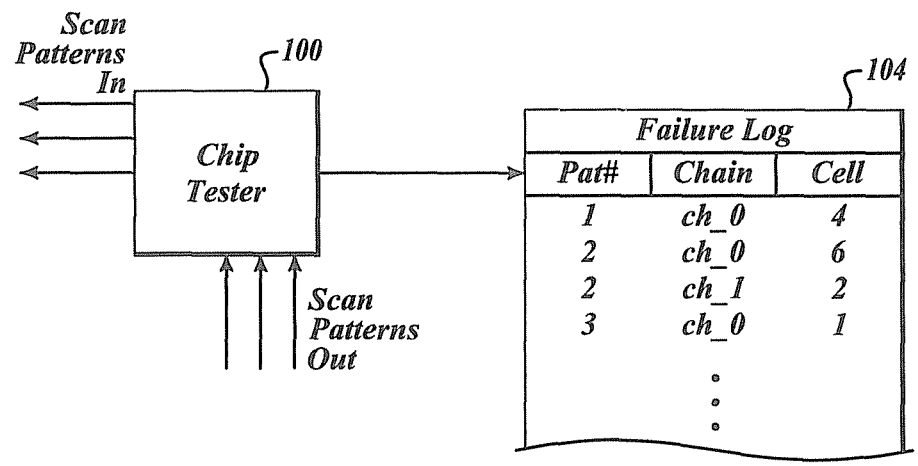
FIG. 3 illustrates a failure log produced by a chip tester.

FIG. 3 illustrates a chip tester 100 that applies test patterns to the scan chains and reads the outputs of the scan chains. If an IC chip is defective, the chip tester produces a failure log 104 that typically records the identification of the failing test pattern, the identification of the scan chain for which an error was detected and which scan cell in the scan chain contained a result that was different than expected.

As will be appreciated by those skilled in the art, manufacturing defects can occur not only in the combinational logic but also in the sequential logic elements that test the combinational logic circuits. In order to test the scan chains for defects, a scan chain test pattern (also known as a flush pattern) such as 00110011 . . . is loaded into the scan chain and read out without operating the scan chains in the normal operation and initiating a capture clocking cycle of the scan cells. If the output pattern read from the scan chain does not match the input pattern, then it can be determined that there is a fault in the scan chain. The type of fault in the scan chain can also be determined from application of the scan chain test pattern. For example, typical faults include a stuck-at-0 fault where a scan cell only outputs logic 0 values or a stuck-at-1 fault where a scan cell only outputs logic 1 value. Because the scan chains are read serially, a stuck-at-0 fault anywhere in the chain will cause the output of the scan chain to be all logic 0's. Similarly, a stuck-at-1 fault will cause the output to be all logic 1's when clocking out the chain test pattern.

Figure 4:
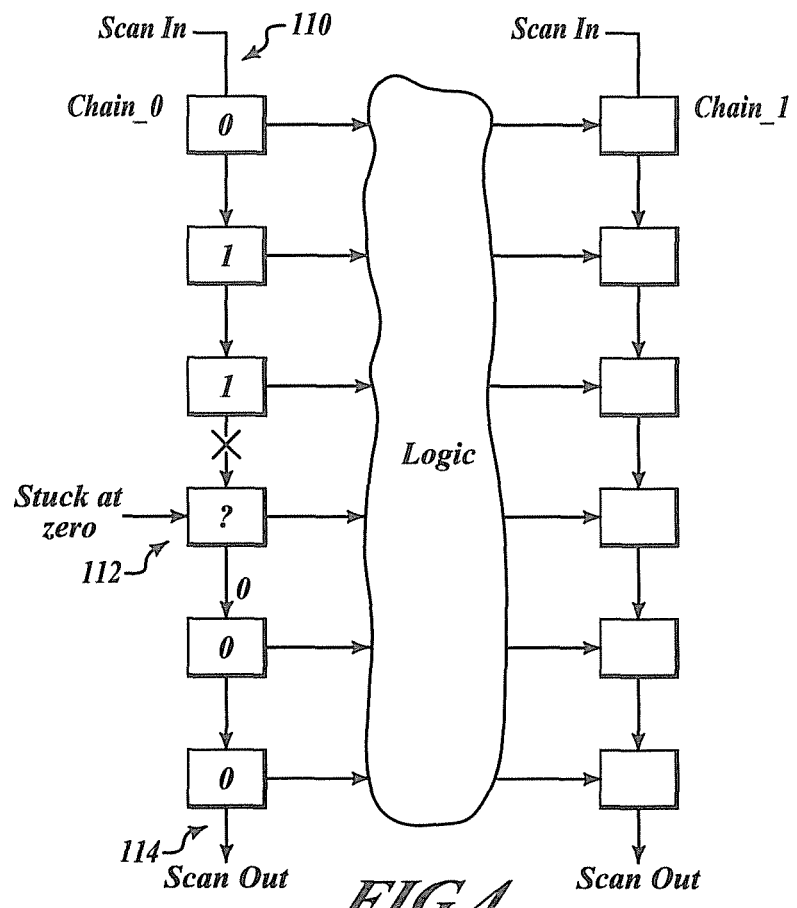
FIG. 4 illustrates a fault in a scan chain.

FIG. 4 illustrates a scan chain 110 with a defective scan cell 112 that has a stuck-at-0 fault. From the output at pin 114, it is not possible to determine which of the scan cells in the scan chain is defective. Other defects can also occur that can be detected with the scan cells. For example, transition faults and hold time faults can also be detected through application of a chain test pattern. Transition faults generally cause logic 0 to 1 or logic 1 to 0 transitions to be delayed by a cycle. Hold time faults cause logic 0 to 1 or 1 to 0 transitions to be faster than one scan shift cycle.

In general, chain test patterns are used to determine the existence and type of a fault, but are not used to determine the location of the one or more faulty scan cells within the faulty scan chain. Subsequent to a faulty scan chain being identified, scan patterns (such as those used to test the combinational logic of an integrated circuit) can be used to identify the one or more faulty scan cells in the scan chain. As described more fully below, for example, failures resulting from application of scan patterns and a fault dictionary can be used to identify one or more faulty scan cells in the faulty scan chain.

In a high volume manufacturing environment, fast and accurate fault diagnosis is desirable to help a yield analysis team quickly root out the cause of failures. With wide adoption of scan-based design-for-test techniques, the detection and proper diagnosis of scan chain failures, including the identification of the faulty scan cells in the faulty scan chain, has become a desirable component of the overall manufacturing flow and can impact yield analysis and product ramp up. Fault diagnosis techniques can be classified into two categories: cause-effect and effect-cause. Effect-cause diagnosis uses fault simulation. Given a set of tester failures, effect-cause diagnosis first identifies a list of candidate faults based on failures observed on a tester. Fault simulation is then performed for the candidate faults. The simulated responses are compared with tester failures to identify the failing location. This approach is powerful because it can handle advanced fault models. However, when the number of candidate faults is large, diagnostic fault simulation becomes a time consuming process.

Another approach which has been used to diagnose combinational logic failures but has not been applied to detect scan chain failures is called cause-effect diagnosis. Cause-effect diagnosis is typically based on pre-calculated fault signatures that are stored in a fault dictionary. Cause-effect diagnosis uses matching information between tester failures and the stored fault signatures to identify the location of defects in an integrated circuit. Because fault signatures are pre-calculated, there is no need for fault simulation during a cause-effect diagnosis process, making the diagnosis process very fast. However, the approach has not been applied to determine scan chain failures in part because the fault dictionary size can be huge for a large design, and is also computationally expensive to create and utilize. Furthermore, dictionary-based diagnosis can lack the flexibility to diagnose defects that do not behave as stuck-at faults.

One embodiment of the disclosed technology is a technique for determining which scan cell(s) is, or is most likely, a defective scan cell in a scan chain by comparing the results of the failure log with a dictionary of predetermined fault signatures. Embodiments of a fault dictionary-based diagnosis approach for scan chain failure diagnosis are disclosed in further detail below. In one embodiment, small dictionaries can be created for scan chain faults by storing differential fault signatures. Based on the differential fault signatures stored in the fault dictionary, the identity of a single scan cell with a stuck-at fault or a timing fault can be quickly determined. Certain embodiments also include the ability to diagnose multiple stuck-at faults in a single scan chain.

Figure 5:
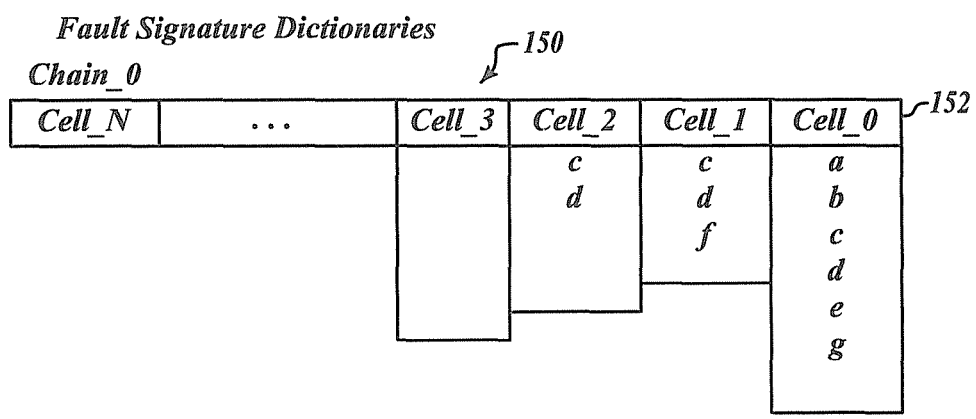
FIG. 5 illustrates a table in a fault dictionary in accordance with one disclosed embodiment.

FIGS. 5 and 6 illustrate one embodiment of a table or entry in a fault dictionary used to determine faulty scan cells. The following definitions are used herein. The "length" of a scan chain refers to the total number of scan cells in the scan chain. Each scan cell in a scan chain can be given an index. For example, the scan cell connected to a scan chain output can be numbered 0 and the cells in the scan chain can be numbered incrementally and sequentially from the scan output to the scan input. The scan cell with index N can be referred to as scan cell N. The scan cells between the scan chain input and the scan input pin of a particular scan cell are referred to herein as the "upstream cells" of this scan cell. The scan cells between the scan chain output and the scan output pin of a particular scan cell are referred to as the "downstream cells" of this scan cell.

In the embodiment shown, a fault dictionary contains a number of tables, data structures, or data structure elements that store the failures that will be produced for each scan pattern assuming an error in each of the individual scan cells in the scan chain. The failures produced as a result of a faulty scan cell are referred to as the scan cell's fault signature. For example, a table 150 is defined for a scan chain "Chain_0" that catalogs each of the failures that will be produced if there is an error in each of the scan cells 0-N in the chain. In the example shown, a fault at cell_0 produces failures (a, b, c, d, e, g) as indicated at entry 152. The failures are shown as letters in FIG. 5 for ease of explanation. During diagnosis, each failure entry in the table will typically be compared directly or indirectly with the failures in the failure log. Therefore each entry of the fault dictionary, for example failure "a", should include information that allows the entry to be compared with entries in the failure log, such as by recording the test pattern number, the scan chain in which the error is detected and which scan cell or bit in the scan chain failure differs from an expected result.

The entries in the table 150 are computed from a logic evaluation of the circuitry in the integrated circuit under test. One table for Chain_0 may be computed for stuck-at-0 faults at each scan cell and another table of failures may be computed for stuck-at-1 faults. Still other tables can be computed for timing or other faults in the cells of the scan chain_0. Other tables in the fault dictionary are computed for the other scan chains assuming faults at each of their scan cells.

In practice the number of scan cells in a scan chain can vary from ten or less to over a thousand. In addition, the number of test patterns that are used to test the combinational logic can be in the range from 50 to 100 or more. Therefore the size of the dictionary required to store the fault signatures for each scan cell in the scan chains can be considerable.

To avoid having to store the complete fault signature for each scan cell in a scan chain, one embodiment of the disclosed technology stores a differential fault signature for each scan cell. For instance, it has been observed that the fault signatures of two adjacent scan cells in a scan chain are usually only slightly different from each other.

TABLE 1

Number of Different Fails of Adjacent Scan Cells

|  | Average # of failures for one cell | Average # of different failures of adjacent cells |
|---|---|---|
| Circuit 1 | 16000 | 5.9 |
| Circuit 2 | 8600 | 7.6 |

In particular, two industrial circuits were analyzed and the number of different failures caused by adjacent scan cell faults were counted for 50 scan test patterns. The results are shown in Table 1. From Table 1, one can see that for 50 scan test patterns in this example, each scan cell fault has thousands of failures in its full fault signature, while the average number of different failures of adjacent scan cell faults is less than 10. That is, on average, the faults of two adjacent scan cells only create less than ten different failures for 50 test patterns, while a majority of the failures are the same.

Thus, in one embodiment of the disclosed technology, in order to reduce fault dictionary size, one can ignore the common failure signatures between two adjacent scan cells while only keeping the small number of different failures in a fault dictionary. The difference between the fault signatures of two adjacent scan cell faults is referenced to herein as the differential signature. Therefore, for each scan chain, one embodiment of the disclosed technology stores the full fault signature for one scan cell (i.e., a base scan cell), while for all the other scan cells, only the differential signature is stored.

In the example shown in FIG. 5, the fault signature for scan cell_1 includes failures (c, d, f). In one embodiment, the failures stored in the table are those that differ from the faults of a neighboring scan cell_0. Similarly, the failures stored in the table for scan cell_2 (i.e., (c, d)) are the differences between scan cell_2 and the failures for the neighboring scan cell_1. As will be appreciated, the full fault signature for any scan cell can be recreated by starting with the base scan cell (cell_0 in the example shown) and adding in the differences stored in the table.

One quick way to compute the full fault signature from a differential signature for any scan cell is to compute the logic exclusive or (XOR) of the entries stored from a base cell and its neighbor in a repeating fashion until the scan cell in question is reached. For example, the full fault signature of cell_1 is (cell_1 XOR the base cell cell_0)=(a, b, e, f, g). The full fault signature for cell_2 is (cell_2 XOR (results from cell_1))=(a, b, c, d, e, f, g) etc.

Because the full fault signature for any given cell may require computing the XOR of the results stored from a base scan cell to the scan cell in question, it may be desirable to store the full fault signature of a base cell in the middle of the table. For example, if there are N=1000 scan cell entries in a table, the full fault signature may be stored for cell_500, which will then be used as the base scan cell to speed computation. However other metrics could also be employed such as storing multiple full fault signatures throughout the table.

Once the tables in the fault dictionary have been computed and stored, they are used to determine the most likely defective scan cell in a scan chain. Once the fault type is known, the exact location of the failing scan cell can be identified by matching the observed failures on a tester with the scan cell fault signatures. For permanent stuck-at or timing faults, one expects a complete match between tester failures and full fault signatures of the defective scan cells. For a single fault, the diagnosis results using approaches disclosed herein should be the same as the results of fault simulation based diagnosis. In one embodiment, the complete fault signature for each scan cell can be reconstructed and compared with the failures observed in the failure log. As shown in FIG. 5, the full fault signature reconstructed for scan cell cell_2 matches the failure log 160 shown in FIG. 6 thereby indicating that cell_2 is the faulty cell.

Given the thousands of failures in the fault signature of a scan cell fault, it is computationally expensive to compute full fault signatures and compare with tester failures. In order to alleviate this issue, one embodiment of the disclosed technology computes and stores the difference between the fault signature of each scan cell and the base signature of the faulty scan chain, which is referred to herein as the relative signature to the base signature. The difference between tester failures and the base signature of the faulty chain under diagnosis are also computed, which may be called the relative tester failures to the base signature. The relative signatures are then compared with the relative tester failures. If a relative signature is the same as one of the relative tester failures, the corresponding full fault signature of the scan cell also matches the full tester failure. For most scan cells, the relative signatures contain many fewer failures than full fault signatures. This result makes it more efficient to calculate the relative signature for each scan cell fault and compare it with the relative tester failures.

As shown in FIG. 6, the relative signature differences between the fault signature for each scan cell and the fault signature of a base scan cell are computed. In the example shown, the base scan cell is scan cell_0. In one embodiment, the relative signature differences are determined by computing the exclusive-OR (XOR) of the failures. For example, the relative difference between the base cell (cell 0) and itself is the empty set (null). The relative signature difference between scan cell_1 and the base scan cello is (cell_1 XOR (null))=(c, d, f) in the example shown. The relative signature difference between scan cell_2 and the base scan cell is (cell_2 XOR (results from cell_1))=(f).

The relative signature differences can then be compared with the relative tester differences between the base scan cell and the failure log 160. In the example shown, the relative tester differences are (failure log XOR cell_0)=(f). This matches the relative signature difference of scan cell_2 thereby indicating that scan cell_2 is the faulty cell.

In some cases there may not be a perfect match between the fault signature computed for each scan cell and the failure log. In that case, the most likely faulty scan cell can be determined by computing how many entries in the fault signature match the entries in the failure log and how many entries do not correspond to entries in the failure log. In this way, the scan cell having the most number of matching entries can be considered the most likely faulty scan cell.

Using the information stored in the fault dictionary, the identity of a faulty scan cell in a scan chain can be quickly determined. In addition, because it is possible to store differences in fault signatures, the size of the fault dictionary can be made smaller thereby saving memory and computer time. In some experimental evaluations, a fault-dictionary-based diagnosis technique in accordance with the embodiments described exhibited performance up to 130 times faster than state of the art fault simulation-based diagnosis techniques while providing comparable diagnosis resolution and accuracy.

Embodiments as disclosed herein can identify single stuck-at faults, timing faults and some multiple stuck-at faults. Desirably, these embodiments can be implemented without requiring any modification to existing scan architecture and can be applied to general scan designs. An approach to identifying multiple stuck-at faults in a faulty scan chain is disclosed below and can be used to diagnose scan chains with multiple stuck-at faults.

If one is unable to find a scan cell whose fault signature completely matches the tester failures, it is possible that there is not a single permanent stuck-at or timing fault in the scan chain. Multiple stuck-at faults or intermittent faults can then be considered for diagnosis.

An exemplary method is described below to diagnosis multiple stuck-at-0 faults or multiple stuck-at-1 faults in a single scan chain. In the description below, multiple stuck-at faults are targeted that cause the same stuck-at behavior at the scan chain output, i.e. either they all show as stuck-at-0 faults at the chain output or they all show as stuck-at-1 faults at the chain output for chain test patterns. Expanding the technology to address arbitrary stuck-at or other faults (e.g., timing faults) in a scan chain is also possible.

During the scan load process, the last fault of a set of multiple faults in a scan chain (the fault closest to the scan chain input) will mask the fault effect of all the other faults in the scan chain. By contrast, during the scan unload process, the first fault of the set of multiple faults (the fault closest to the scan chain output) will mask the fault effect of all the other scan chain faults. For combinational test patterns where only one capture cycle is applied between scan load and scan unload, the impact of the faults that are between the first and the last faults is masked by the first and the last faults. In order to identify the faults between the first and the last faults, sequential test patterns with more than one capture cycle or scan patterns with special shift and unload procedures can be used to observe their fault effects. The discussion below focuses on the identification of the first and the last faults in a scan chain.

Figure 7:
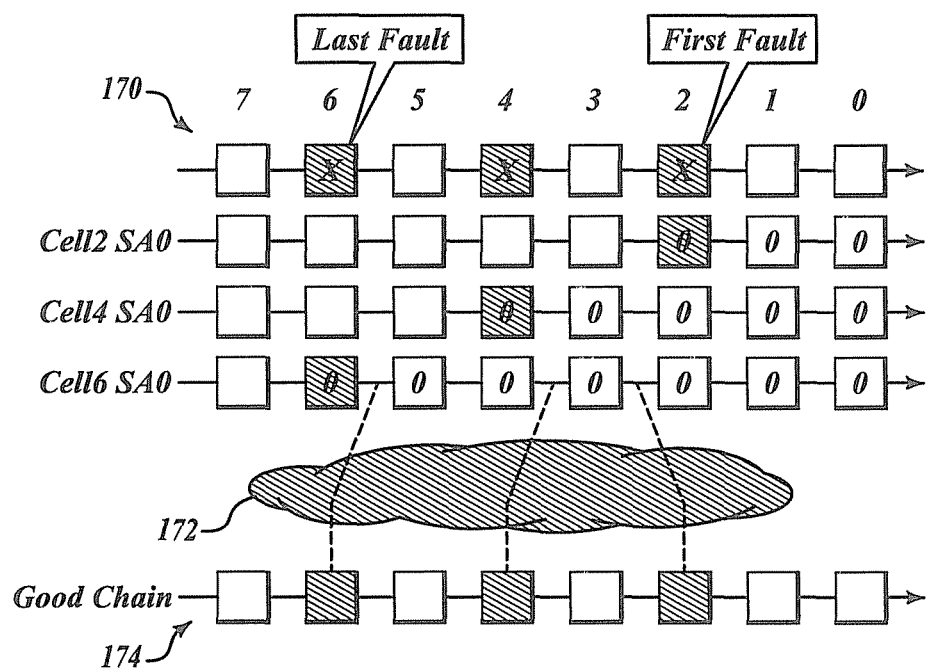
FIG. 7 illustrates a technique for identifying a last fault of two or more defective scan cells in a scan chain in accordance with one disclosed embodiment.

For multiple stuck-at faults in a scan chain, one can first identify the last fault. During the scan load process, the last fault masks fault impact of all other scan cell faults in the same scan chain. FIG. 7 shows an illustration of a scan chain 170 having multiple stuck-at faults. The scan chain 170 provides inputs to a combinational logic circuit 172 that in turn provides inputs to a second scan chain 174. For purposes of this example, it is assumed that the second scan chain 174 has no faults. In the example shown, there are 3 stuck-at-0 (SA0) faults in the scan chain 170 on scan cells 2, 4 and 6 respectively. The last fault is at scan cell 6. During the scan load process, the stuck-at-0 fault at scan cell 6 causes scan cells 6 through 0 to load a logic value 0. The scan cell 4 stuck-at-0 fault causes scan cells 4 through 0 to load value 0 and the stuck-at-0 fault at scan cell 2 causes scan cells 2, 1 and 0 to load logic value 0s. Note that the impact of the stuck-at-0 fault at scan cell 6 masks the impact of the stuck-at-0 faults at scan cells 4 and 2 during the scan load process. In other words, the impact on scan load values of the last fault is the same as that of the multiple faults. Furthermore, the failures observed on good scan chains or primary outputs (POs) (e.g., output pins) are only impacted by scan load values of the faulty scan chain. Based on this analysis, one can say that failures observed on good chains and POs caused by the last fault should be the same as those caused by the multiple scan cell faults. These failures can be used to identify the location of the last fault. Because the values captured by the scan chain 170 may be changed during the read out process by the yet unknown first fault (cell 2 in the example shown), the captured values may not be reliably used to compare against the failures in the failure log. Therefore in one embodiment of the disclosed technology only the values captured by the good scan chains are compared with the failures stored in the failure log.

While diagnosing the last fault, the failures stored in the failure log are partitioned into two groups. One group contains failures on the faulty scan chain and the other group contains failures on good scan chains and POs. Similarly, the differential fault signatures stored in a fault dictionary can be partitioned into fault signatures with only faulty chain failures and fault signatures with only good chain and PO failures. In an exemplary approach to identify the last fault location, the fault signatures for a scan cell are only compared with faults detected on good scan chains and POs. A match between these two sets of faults indicates a candidate scan cell of the last fault. If multiple candidate scan cells for the last fault are identified, then the candidate having the highest number of matches can be selected initially as the last fault.

Once the last fault is identified, the first fault in the scan chain can be identified. In an exemplary approach, the failures detected on the faulty scan chain are used to identify the first fault. Note that during the scan chain unload process, for scan cells between the first fault location and the scan chain input, the first fault masks the fault effects of other faults in the faulty scan chain. For the scan cells between the first fault location and the scan chain output, the scan chain unload values are not impacted by any scan cell faults during the scan unload process. Unload values of these scan cells should reflect the scan capture values which are determined by the scan load values. Since the last fault in a scan chain dominates the impact to scan load values, its fault signature reflects the captured values of the cells that are downstream of the first fault. Stated another way, since the scan cell values downstream of the first fault (that is, in the scan cells toward the scan chain output from the first fault) are not affected by the first fault during the read out process, any errors detected must have been a result of values loaded into the those downstream cells during the capture cycle, which are dominated by the last fault. Similarly any upstream cells from the first fault are masked by the first fault. Therefore a composite fault signature can be generated for the first fault scan cell that includes a first partial fault signature for the downstream cells taken from the last fault cell. A second partial fault signature is taken from the upstream scan cells of the first fault cell. Such an approach is shown in FIG. 8.

In order to identify the first faulty cell N, one embodiment of the disclosed technology creates a composite fault signature with two pieces of information for faulty chain failures: (1) failures on scan cell N and its upstream scan cells and (2) failures on the scan cells that are downstream of scan cell N. The first piece of information or partial fault signature can be extracted from the fault signature of the fault at scan cell N while the second piece of information or second partial fault signature can be extracted from the fault signature of the last fault identified. The two pieces of information or partial fault signatures are combined to produce the composite fault signature for the first fault. As shown in FIG. 8, a composite fault signature 180 for a possible first faulty scan cell N is created by taking the failures for scan cell N and its upstream cells from the fault signature of scan cell N and adding the failures for the downstream scan cells from the fault signature of the last fault (i.e. cell 6 in the example shown).

Figure 8:
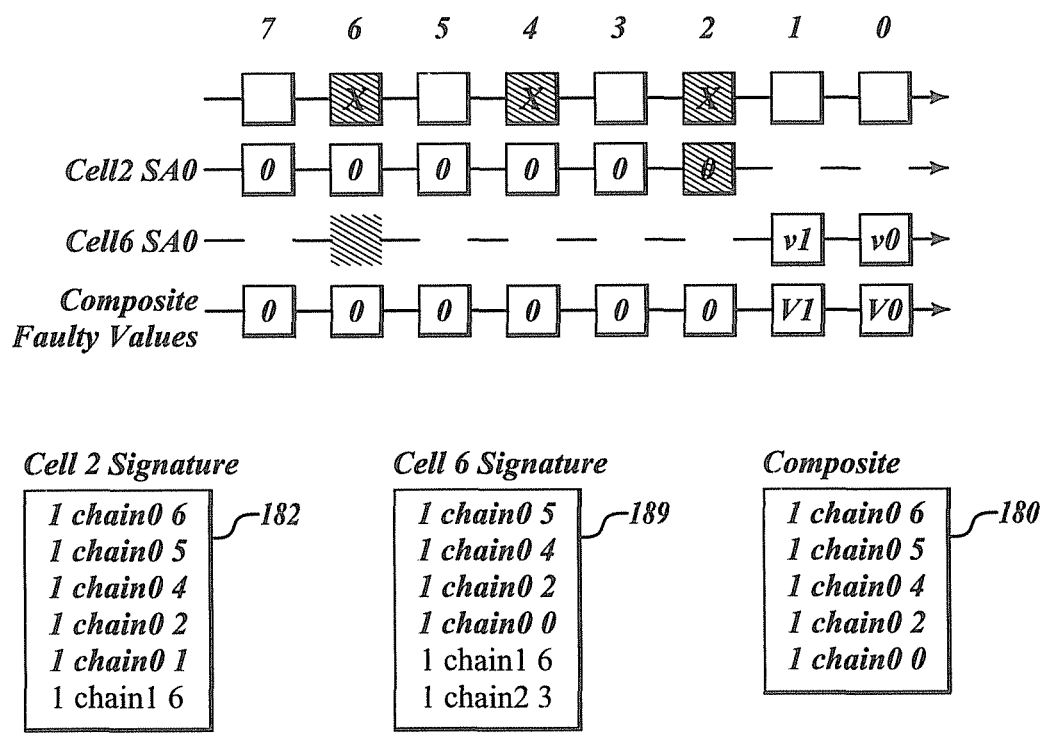
FIG. 8 illustrates a composite fault signature used to detect a first fault in a scan chain in accordance with another disclosed embodiment.

In the example shown in FIG. 8, assume one desires to know whether scan cell 2 is a candidate for the first fault. Assume from a previous analysis that it is known that scan cell 6 is a candidate for the last fault. The composite fault signature 180 in this example consists of two pieces of information: the failures on scan cells 7 through 2 and failures of scan cells 1 and 0. For failures on scan cells 7 through 2, one can use the differential signature for the stuck-at-0 fault at scan cell 2. For failures on scan cells 1 and 0, the differential signature for the failures on scan cells 1 and 0 are obtained from the stuck-at-0 fault at scan cell 6. If the composite fault signature 180 matches faulty chain failures observed on silicon, scan cell 2 is a candidate of the first fault. In the case where there are multiple candidates for the last fault, one can, for example, use the candidate cell with the lowest index during the first fault identification process. This approach helps to avoid an excessive searching effort while still achieving good diagnosis accuracy.

Given a candidate for the last fault, one can search for a scan cell N such that the composite signature from the last fault and the fault at scan cell N matches faulty chain failures observed on a tester. Note that the above analysis works for combinational test patterns and sequential test patterns where the faulty scan cells do not impact the capture values of fault-free scan cells in the faulty scan chain.

In cases where the above approach fails to identify a single scan cell fault signature or a composite signature that exactly matches tester failures, one can assume that there is an intermittent fault in the scan chain. For intermittent fault diagnosis, one can use known matching and scoring techniques (e.g., such as disclosed in R. Guo et al., "A Technique for Fault Diagnosis of Defects in Scan Chains," ITC, 2001, pp. 266-277). In certain embodiments, for example, scan cells in a faulty chain can be ranked based on matching scores between the fault signatures and tester failures.

Experiments were performed on several industrial circuits to evaluate the effectiveness of the methods disclosed herein. Design features of each circuit are given in Table 2. For each circuit, the differential signatures of all scan cell faults for 50 scan test patterns were pre-calculated and stored in fault dictionaries in accordance with the above description. Depending on the design sizes and the scan chain lengths, CPU times to create fault dictionaries can be quite different. For the three circuits used in these experiments, the CPU times to create fault dictionaries for all the stuck-at and timing faults took from several hours to several days.

Once the fault dictionaries were created, the first experiment involved an evaluation of the size of the fault dictionary and its impact on diagnosis memory usage. Table 3 shows the number of failures for full fault signatures and the number of differential failures in fault dictionaries. The reduction ratio between these two numbers is also shown. For all the three circuits, comparing the storage of differential failures with full fault signatures, the approach disclosed herein reduced the number of failures to be stored in the fault dictionaries by 535, 300 and 2408 times respectively. It is interesting to point out that the reduction ratios are roughly proportional to the scan chain lengths of the circuits. Table 4 shows the impact of fault dictionaries on memory usage of the diagnosis tool. From Table 4, one can see that with fault dictionaries, the added memory overhead varies from 2.8 MB to 60 MB (or from 1.8% to 13.3%).

TABLE 2

Designs Used in the Experiments

| Circuit | #Gate | #Chain | #ChainLength |
|---|---|---|---|
| A | 70K | 8 | 725 |
| B | 701K | 27 | 430 |
| C | 506K | 16 | 2570 |

TABLE 3

Comparing Fault Dictionary and Full Signatures

| | #Failures for Full Signatures | #Failures in Fault Dictionaries | Reduction Ratio |
|---|---|---|---|
| A | 528M | 0.98M | 535 |
| B | 522M | 1.74M | 300 |
| C | 16.2 G | 16.78M | 2408 |

TABLE 4

Diagnosis Tool Memory Usage

| Circuit | Without fault dictionary | With fault dictionary | Memory Overhead | Overhead Percentage |
|---|---|---|---|---|
| A | 102.3 MB | 105.1 MB | 2.8 MB | 2.7% |
| B | 550.3 MB | 560.3 MB | 10.0 MB | 1.8% |
| C | 451.1 MB | 511.3 MB | 60.2 MB | 13.3% |

The next experiment was performed to evaluate the effectiveness of an exemplary diagnosis flow. Single fault diagnosis and multiple fault diagnosis were performed separately. For each category, 100 faults (or fault pairs for multiple fault diagnosis) were randomly injected for each circuit. Fault simulation was performed to create simulation mismatches between expected responses and fault simulation responses. The simulation mismatches were used as tester failures in this experiment. The results of this diagnosis were compared with several previously published diagnosis techniques, specifically those described in R. Guo, S. Venkataraman, "A Technique For Fault Diagnosis of Defects in Scan Chains", ITC, 2001, pp. 268-277; Y. Huang, W.-T. Cheng, S. M. Reddy, C.-J. Hsieh, Y-T. Hung, "Statistical Diagnosis for Intermittent Scan Chain Hold-Time Fault", ITC, 2003, pp. 319-328; Y. Kao, W. Chuang and J. Li, "Jump Simulation: A Technique for Fast and Precise Scan Chain Fault Diagnosis", ITC 2006, paper no. 22.1. In this experiment, if a diagnosis result contained the target scan cell and if it had less than five scan cells as candidates, it was considered a good diagnosis which can provide useful information for physical failure analysis. The diagnosis results are shown in Table 5. From this table, it can be observed that fault simulation based diagnosis (R. Guo, S. Venkataraman, "A Technique For Fault Diagnosis of Defects in Scan Chains", ITC, 2001, pp. 268-277; Y Huang, W-T. Cheng, S. M. Reddy, C.-J. Hsieh, Y-T. Hung, "Statistical Diagnosis for Intermittent Scan Chain Hold-Time Fault", ITC, 2003, pp. 319-328) (under columns "Sim") and the exemplary dictionary based fault diagnosis technology disclosed herein (under columns "Dic") achieved the same diagnosis results for all single fault diagnosis cases. This is reflected in the percentage of good diagnosis in the second and third columns in Table 5. The last three columns show the CPU times used by fault simulation based diagnosis (R. Guo, S. Venkataraman, "A Technique For Fault Diagnosis of Defects in Scan Chains", ITC, 2001, pp. 268-277; Y. Huang, W.-T. Cheng, S. M. Reddy, C.-J. Hsieh, Y.-T. Hung, "Statistical Diagnosis for Intermittent Scan Chain Hold-Time Fault", ITC, 2003, pp. 319-328), the exemplary fault dictionary based diagnosis technology disclosed herein, and their ratios. It can be seen that fault dictionary based diagnosis can take much less CPU time than fault simulation based diagnosis. For example, for circuit C, it took fault simulation based diagnosis more than 4 hours to diagnose 100 test cases, while it took only 4 minutes for fault dictionary based diagnosis. The average speedup of the new technology in comparison to fault simulation based techniques varied from 8 to 97 for the three circuits. Note that the fault simulation based diagnosis used in this experiment used similar speedup techniques as presented in Y. Kao, W Chuang and J. Li, "Jump Simulation: A Technique for Fast and Precise Scan Chain Fault Diagnosis", ITC 2006, paper no. 22.1. The speedup for circuit A is believed to be small due to the fact that A is a small circuit and non-simulation activities (e.g. reading tester failures, loading fault dictionaries) took a larger portion of total diagnosis run time.

TABLE 5

Diagnosis Results for Single Faults (100 cases) (Sim: Fault simulation based diagnosis; Dic: Dictionary based diagnosis)

| Circuit | % Good Diag | | Total CPU Time (seconds) | | |
|---|---|---|---|---|---|
| | Sim. | Dic. | Sim. | Dic. | Ratio |
| A | 80% | 80% | 250 | 31 | 8 |
| B | 52% | 52% | 3556 | 36 | 97 |
| C | 52% | 52% | 15138 | 246 | 57 |

In Table 6, one can compare fault dictionary based diagnosis and fault simulation based diagnosis for multiple stuck-at fault diagnosis. The percentage of good diagnosis is calculated based on good diagnosis of the first fault and the last fault, with each fault being given 50% credit for a test case. From Table 6, it can be observed that fault dictionary based diagnosis technology disclosed herein achieved similar or a little better diagnosis results (for Circuit B) than fault simulation based diagnosis (R. Guo, S. Venkataraman, "A Technique For Fault Diagnosis of Defects in Scan Chains", ITC, 2001, pp. 268-277; Y. Huang, W.-T. Cheng, S. M. Reddy, C.-J. Hsieh, Y.-T. Hung, "Statistical Diagnosis for Intermittent Scan Chain Hold-Time Fault", ITC, 2003, pp. 319-328; Y. Kao, W. Chuang and J. Li, "Jump Simulation: A Technique for Fast and Precise Scan Chain Fault Diagnosis", ITC 2006, paper no. 22.1), but the CPU times used by the new fault dictionary based diagnosis technology are much shorter. For example, for circuit B, it took fault simulation based diagnosis 1.8 hours to diagnosis 100 test cases, while it took less than one minute for fault dictionary based diagnosis. The average speed-up achieved by the new technology over fault simulation based diagnosis varied from 14 to 130. Note that the percentage of good diagnosis cases in this example using the new technology is lower than the case of single fault diagnosis. One reason may be due to the nature of the complicated behavior of multiple faults. In experiments, multiple stuck-at faults have been observed to behave like single stuck-at fault while this single fault candidate doesn't match any injected faults.

TABLE 6

Diagnosis Results for Multiple Stuck-At Faults (Sim: Fault simulation based diagnosis; Dic: Dictionary based diagnosis)

| Circuit | % Good Diagnosis | | Total CPU Time (seconds) | | |
|---|---|---|---|---|---|
| | Sim. | Dic. | Sim. | Dic. | Ratio |
| A | 35% | 35% | 1008 | 68 | 14 |
| B | 34% | 41% | 6565 | 50 | 130 |
| C | 25% | 24% | 11909 | 546 | 22 |

Figure 9:
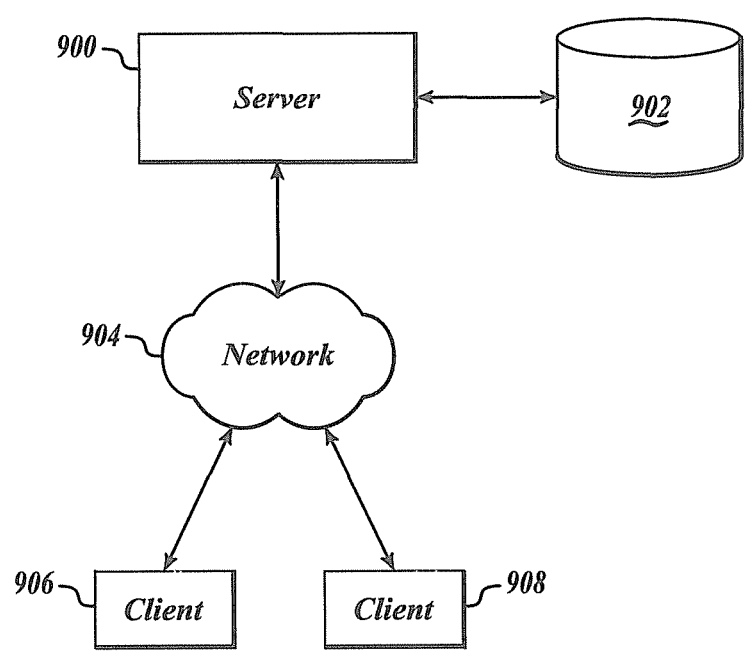
FIG. 9 is a schematic block diagram of a network as may be used to perform fault diagnosis according to any of the disclosed embodiments.

As will be appreciated from the above description, exemplary embodiments of dictionary-based fault diagnosis approaches for scan chain failure diagnosis are disclosed herein. For example, differential signatures can be stored in fault dictionaries to minimize the redundancy of fault signatures of adjacent scan cell faults. Based on the differential signatures stored in a fault dictionary, exemplary diagnosis approaches can be used to diagnose faults, such as single stuck-at faults, timing faults and some multiple stuck-at faults in a single scan chain. Experimental results on industrial designs show that, in comparison to some fault simulation based diagnosis techniques, the new diagnosis approaches significantly improve the diagnosis speed while still achieving desirable diagnostic resolution and accuracy. The fault dictionary described above may be used with either compressed or non-compressed scan test patterns. Compressed patterns allow fewer tests to be performed to detect manufacturing defects in the combinational logic of a circuit under test. One description of compressed patterns can be found in Janusz et al. "Embedded Deterministic Test for Low Cost Manufacturing Test", ITC Test Conference, pages 301-310, D-7803-7542-4/02 IEEE 2002, and Yu Huang et al., "Compressed Pattern Diagnosis For Scan Chain Failures," International Test Conference, Paper 30.3, 2005 IEEE, which are herein incorporated by reference Any of the aspects of the technology described above may be performed using a distributed computer network. FIG. 9 shows one suitable exemplary network. A server computer 900 can have an associated storage device 902 (internal or external to the server computer). For example, the server computer 900 can be configured to perform fault diagnosis using any of the disclosed methods (for example, as part of an EDA software tool, such as a fault diagnosis or ATPG tool). The server computer 900 can be coupled to a network, shown generally at 904, which can comprise, for example, a wide-area network, a local-area network, a client-server network, the Internet, or other suitable network. One or more client computers, such as those shown at 906, 908, may be coupled to the network 904 using a network protocol. The work may also be performed on a single, dedicated workstation, which has its own memory and one or more CPUs.

Figure 10:
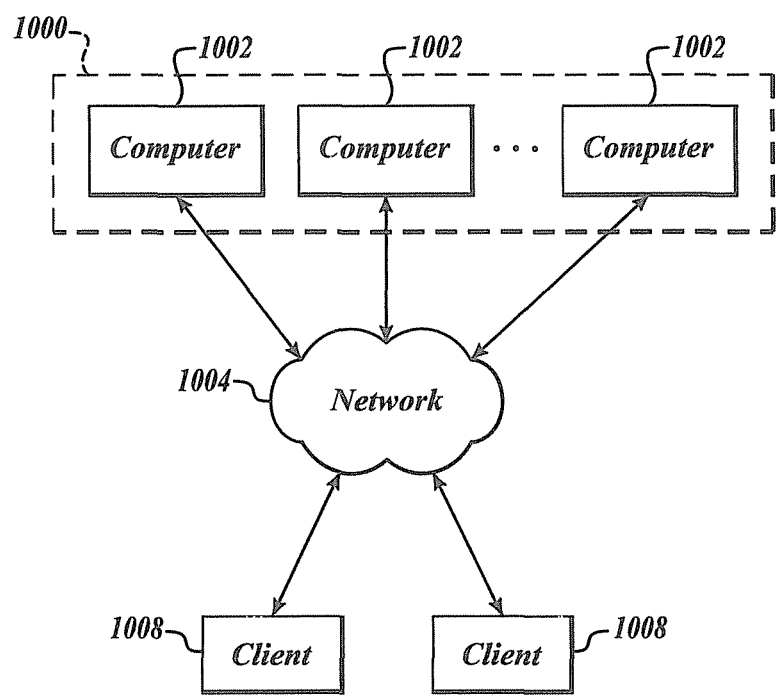
FIG. 10 is a schematic block diagram of a distributed computing network as may be used to performing fault diagnosis according to any of the disclosed embodiments.

FIG. 10 shows another exemplary network. One or more computers 1002 communicate via a network 1204 and form a computing environment 1000 (for example, a distributed computing environment). Each of the computers 1002 in the computing environment 1000 can be used to perform at least a portion of the test pattern generation process. The network 1004 in the illustrated embodiment is also coupled to one or more client computers 1008.

Figure 11:
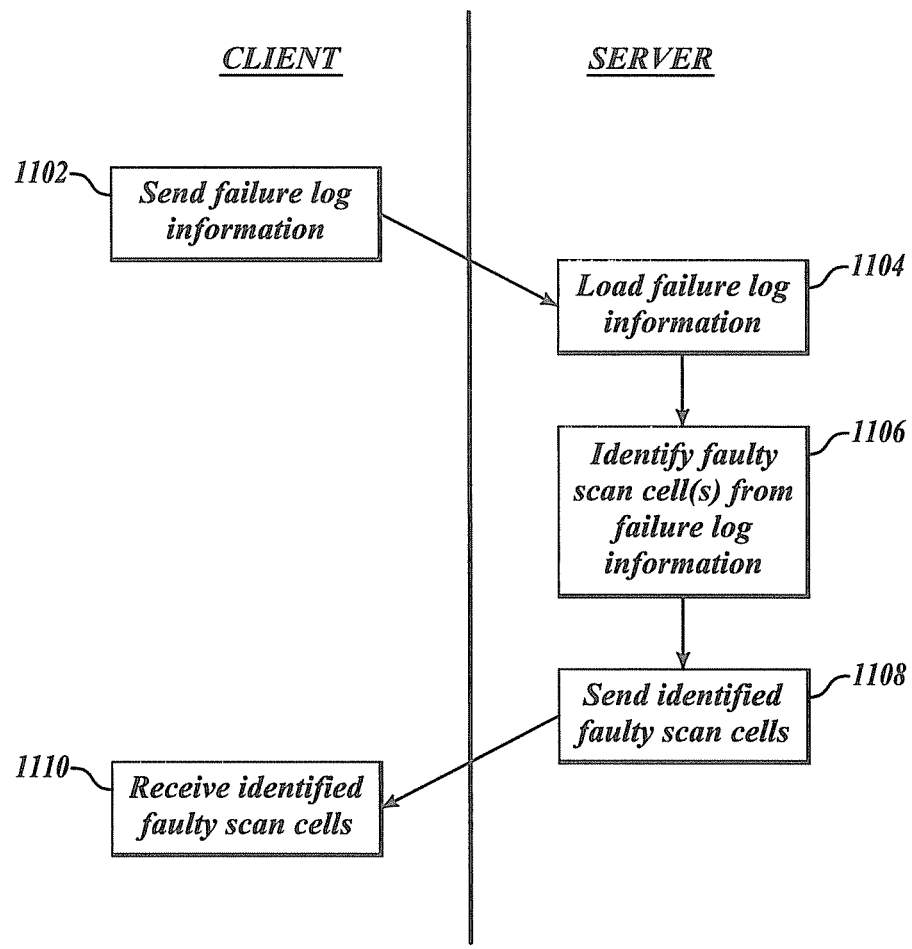
FIG. 11 is a flowchart illustrating how fault diagnosis can be performed using the networks of FIG. 9 or FIG. 10.

FIG. 11 shows one exemplary manner in which the networks of FIGS. 9 and 10 can operate to diagnose one or more faults in an electronic circuit. In particular, FIG. 11 shows that one or more entries of a failure log can be analyzed using a remote server computer (such as the server computer 900 shown in FIG. 9) or a remote computing environment (such as the computing environment 1000 shown in FIG. 10) in order to diagnosis and identify failing scan cells according to any embodiment of the disclosed technology. At 1102, for example, the client computer sends one or more entries of the failure log (or the failure log itself) to the remote server or computing environment. At 1104, the failure log information is received and loaded by the remote server or by respective components of the remote computing environment. At 1106, fault diagnosis is performed to identify and store one or more faulty scan cells according to any of the disclosed embodiments. At 1108, the remote server or computing environment sends the identified scan cells to the client computer, which receives the data at 1110.

It should be apparent to those skilled in the art that the example shown in FIG. 11 is not the only way to diagnose scan chain faults using embodiments of the disclosed technology with multiple computers. For instance, the failure log information may be stored on a computer-readable medium that is not on a network and that is sent separately to the server or computing environment (for example, a CD-ROM, DVD, or portable hard drive). Or, the server computer or remote computing environment may perform only a portion of the fault diagnosis procedure. The computing environments of FIGS. 9 and 10 can similarly be used to generate fault dictionaries according to any of the disclosed embodiments.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of the following claims and equivalents thereof.

We claim:

1. A method of generating a fault dictionary to determine faulty scan cells in a scan chain, comprising:
   by a computer:
      receiving a description of an integrated circuit that includes combinational and sequential logic that can be tested by applying test patterns to the sequential logic and reading scan chain outputs;
      for one or more scan cells in scan chains, determining respective lists of failures that will be observed at the scan chain outputs when each of the one or more scan cells has a defined fault; and
      storing a fault dictionary representative of the respective lists of failures for each of the one or more scan cells.

2. The method of claim 1, further comprising:
   determining a difference between failures for a first scan cell in a scan chain versus failures for a second scan cell in the scan chain; and
   storing the difference in failures as a fault signature for the first scan cell in the fault dictionary.

3. The method of claim 2, wherein the first scan cell and the second scan cell are adjacent to one another in a respective scan chain.

4. The method of claim 1, further comprising storing a complete list of failures as a fault signature for at least one scan cell in a respective scan chain in the fault dictionary.

5. The method of claim 1, wherein the storing a fault dictionary representative of the respective lists of failures for each of the one or more scan cells comprises:
   storing a complete fault signature for a first scan cell; and
   storing an incomplete differential fault signature for a second scan cell from which a complete fault signature for the second scan cell can be recreated.

6. The method of claim 1, wherein the storing a fault dictionary representative of the respective lists of failures for each of the one or more scan cells comprises:
   determining a differential fault signature from which a complete fault signature can be determined with reference to a base fault signature; and
   storing the differential fault signature.

7. One or more non-transitory computer-readable media storing a sequence of instructions that are executable by a computer to perform a method, the method comprising:
   receiving a description of an integrated circuit that includes combinational and sequential logic that can be tested by applying test patterns to the sequential logic and reading scan chain outputs;
   for one or more scan cells in scan chains, determining respective lists of failures that will be observed at the scan chain outputs when each of the one or more scan cells has a defined fault; and
   generating a fault dictionary representative of the respective lists of failures for each of the one or more scan cells.

8. The one or more non-transitory computer-readable media of claim 7, wherein the method further comprises:
   determining a difference between failures for a first scan cell in a scan chain versus failures for a second scan cell in the scan chain; and
   storing the difference in failures as a fault signature for the first scan cell in the fault dictionary.

9. The one or more non-transitory computer-readable media of claim 8, wherein the first scan cell and the second scan cell are adjacent to one another in a respective scan chain.

10. The one or more non-transitory computer-readable media of claim 7, wherein the method further comprises storing a complete list of failures as a fault signature for at least one scan cell in a respective scan chain in the fault dictionary.

11. The one or more non-transitory computer-readable media of claim 7, wherein the generating a fault dictionary representative of the respective lists of failures for each of the one or more scan cells comprises:
   generating a complete fault signature for a first scan cell; and
   generating an incomplete differential fault signature for a second scan cell from which a complete fault signature for the second scan cell can be recreated.

12. The one or more non-transitory computer-readable media of claim 7, wherein the generating a fault dictionary representative of the respective lists of failures for each of the one or more scan cells comprises generating a differential fault signature from which a complete fault signature can be determined with reference to a base fault signature.

13. A system, comprising:
   a processor; and
   a memory storing instructions which when executed by the processor cause the processor perform a method, the method comprising:
      receiving a description of an integrated circuit that includes combinational and sequential logic that can be tested by applying test patterns to the sequential logic and reading scan chain outputs;
      for one or more scan cells in scan chains, determining respective lists of failures that will be observed at the scan chain outputs when each of the one or more scan cells has a defined fault; and
      storing a fault dictionary representative of the respective lists of failures for each of the one or more scan cells.

14. The system of claim 13, wherein the method further comprises:
   determining a difference between failures for a first scan cell in a scan chain versus the failures for a second scan cell in the scan chain; and
   storing the difference in failures as a fault signature for the first scan cell in the fault dictionary.

15. The system of claim 14, wherein the first scan cell and the second scan cell are adjacent to one another in a respective scan chain.

16. The system of claim 13, wherein the method further comprises storing a complete list of failures as a fault signature for at least one scan cell in a respective scan chain in the fault dictionary.

17. The system of claim 13, wherein the storing a fault dictionary representative of the respective lists of failures for each of the one or more scan cells comprises:
   storing a complete fault signature for a first scan cell; and
   storing an incomplete differential fault signature for a second scan cell from which a complete fault signature for the second scan cell can be recreated.

18. The system of claim 13, wherein the storing a fault dictionary representative of the respective lists of failures for each of the one or more scan cells comprises:
   determining a differential fault signature from which a complete fault signature can be determined with reference to a base fault signature; and
   storing the differential fault signature.

* * * * *